US005671239A

United States Patent [19]
Higashitani et al.

[11] Patent Number: 5,671,239
[45] Date of Patent: Sep. 23, 1997

[54] SEMICONDUCTOR MEMORY OF XN TYPE HAVING ERROR CORRECTING CIRCUIT BY PARITY

[75] Inventors: Masaaki Higashitani; Masatomo Hasegawa, both of Kawasaki, Japan

[73] Assignee: Fujitsu Limited, Tokyo, Japan

[21] Appl. No.: 588,693

[22] Filed: Jan. 19, 1996

Related U.S. Application Data

[63] Continuation of Ser. No. 307,421, Sep. 19, 1994, abandoned.

[30] Foreign Application Priority Data

Sep. 20, 1993 [JP] Japan ................... 5-233956
Nov. 10, 1993 [JP] Japan ................... 5-281436

[51] Int. Cl.$^6$ .................................. G11C 29/00
[52] U.S. Cl. .................................. 371/51.1
[58] Field of Search .................. 371/51.1, 40.1, 371/40.4; 364/265.3, 266.3, 944, 945.6, 970.1; 365/201

[56] References Cited

U.S. PATENT DOCUMENTS

| | | | |
|---|---|---|---|
| 4,464,755 | 8/1984 | Stewart | 371/51 |
| 4,672,614 | 6/1987 | Yoshida | 371/38 |
| 4,688,219 | 8/1987 | Takemae | 371/10 |
| 5,079,747 | 1/1992 | Nakada | 361/230.01 |
| 5,088,092 | 2/1992 | Jeppesen, III et al. | 371/49.3 |
| 5,140,597 | 8/1992 | Araki | 371/51.1 |
| 5,151,906 | 9/1992 | Sawada | 371/51.1 |
| 5,249,158 | 9/1993 | Kynett et al. | 365/230.03 |
| 5,260,555 | 11/1993 | Sakamoto | 235/492 |
| 5,305,276 | 4/1994 | Uenoyama | 365/230.01 |
| 5,367,526 | 11/1994 | Kong | 371/51.1 |
| 5,426,608 | 6/1995 | Higashitani et al. | 365/200 |
| 5,448,577 | 9/1995 | Wells et al. | 371/40.1 |
| 5,452,311 | 9/1995 | Wells et al. | 371/51.1 |

*Primary Examiner*—Robert W. Beausoliel, Jr.
*Assistant Examiner*—Stephen C. Elmore
*Attorney, Agent, or Firm*—Nikaido Marmelstein Murray & Oram LLP

[57] ABSTRACT

A memory device for storing data of a multi-bit structure in a plurality of memory cell blocks has a parity cell block having the same structure as the memory cell block. If read data contains an error bit, this error bit is corrected by an EOR calculation of correct bits and a parity bit. The address of an error bit is written in a defective cell memory made of fuses for example. In the case of a flash memory, a parity calculation and a parity data write operation are performed at the same time when data is written.

12 Claims, 8 Drawing Sheets

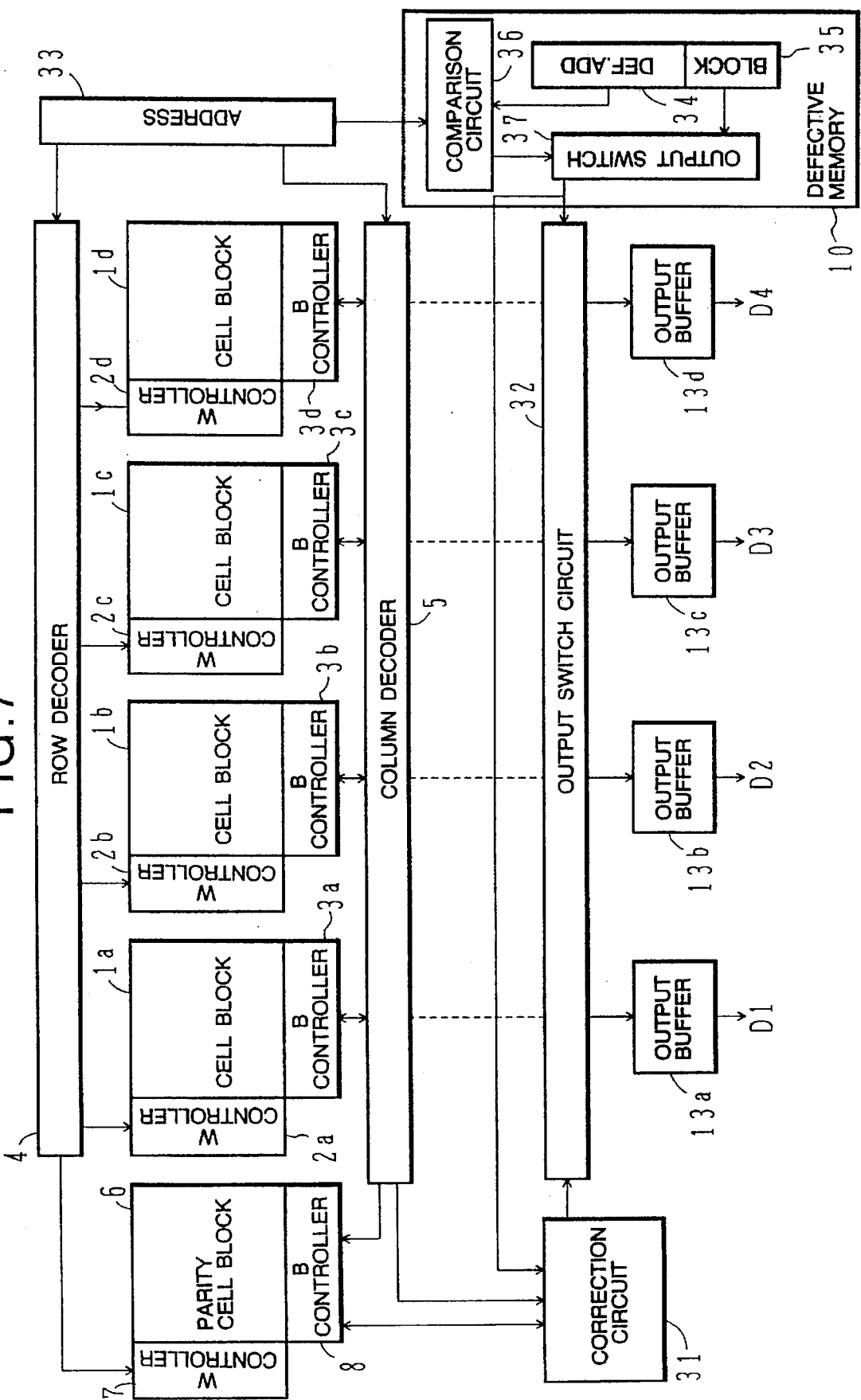

SEMICONDUCTOR MEMORY OF XN TYPE HAVING ERROR CORRECTING CIRCUIT BY PARITY

This application is a continuation of application Ser. No. 08/307,421 filed Sep. 19, 1994, now abandoned.

BACKGROUND OF THE INVENTION a) Field of the Invention

The present invention relates to a semiconductor memory, particularly a flash type semiconductor memory and a mask ROM type semiconductor memory.

b) Description of the Related Art

Demands for a high capacity semiconductor memory are increasing nowadays. Such demands are eminent particularly for a flash memory which can electrically erase the contents of stored data while keeping a large capacity specific to EPROM and is expected to become a substitute for a magnetic disk or other large capacity storage devices.

Like an EPROM, a flash memory writes data by injecting hot electrons into a floating gate, and erases the data by removing electric charges stored in the floating gate in the form of a tunnel current. In an erase operation, data "1" is written in all memory cells and then the data in all the cells are erased.

In a NOR type flash memory, data "0" and "1" are stored in correspondence with two threshold values HVth and LVth of an enhancement type MOS transistor. If electric charges are stored in the floating gate between the control gate and the channel, this state represents "1", whereas if not, it represents "0". Two threshold values HVth and LVth are, for example, about 7 V and 3 V.

Under the condition that 0 V is applied to the source, 1 V is applied to the drain, and 5 V is applied to the control gate, if the threshold value is high HVth, then the channel is not on, whereas if the threshold value is low LVth, then the channel is on. From this difference, data in the memory cell can be read. In a non-selected memory cell, the drain is made to be in a floating state, and the control gate is applied with 0 V.

If data "1" is to be written in a selected memory cell, the drain is applied with 6 V, and the control gate is applied with 12 V. In this case, electrons become hot electrons which tunnel through the oxide film over the channel and are injected into the floating gate to write data "1".

In an erase operation, data "1" is written in all cells, and thereafter, 0 V is applied to the control gates of all the cells and 12 V is applied to the sources, while making the drains be in a floating state. In this case, electrons stored in floating gates tunnel through oxide films to the sources.

In a memory cell array, control gates on the same row are connected to the same word line, and drains on the same column are connected to the same bit line.

Consider now that two word lines of such a flash memory are short-circuited. If an erase operation is performed in such a case, cells having a threshold value other than the predetermined value are generated. Specifically, even if 12 V is applied to one word line connected to the memory cell storing data "0", the other word line is applied with 0 V. Therefore, the voltage of the word lines cannot take a sufficiently high value, and the memory cells connected to the short-circuited word lines take an insufficient write state.

Next, 0 V and 12 V are applied to all word lines (control gates) and sources, respectively, in order to erase the contents of all cells. Electrons in the floating gates of the memory cells in the insufficient write state are taken out excessively, and the floating gates are positively charged. This is called an over erase.

If data "1" is written in a memory cell in an over erase state, an insufficient write state occurs because the initial level of the threshold value is not 0 but a positive potential (negative storage) and a sufficient voltage cannot be applied to the word line due to the short-circuiting. As described above, data cannot be written to all memory cells connected to the short-circuited word lines.

It is meaningless to use redundant cells on short-circuited word lines. Redundant cells are therefore connected to bit lines (on the column side).

If there is a memory cell in an over erase state, other cells connected to the same bit line are also unable to read data.

If a memory cell transistor has a negative threshold value because of an over erase, a current flows through the bit line even if the transistor is not selected and 0 V is applied. As a result, if a memory cell from which data is read is connected to the same bit line as such a memory cell with a negative threshold value, a current flows through the bit line, irrespective of the threshold value of the cell.

Another approach to a redundancy operation for a flash memory is to use a redundant cell block. With this approach, a memory is divided into a plurality of blocks, and if there is a defective block, it is replaced by a redundant block. In this case, when an address decoded by an address decoder indicates the defective block, this address is translated into an address of the redundant block.

As described above, an appropriate redundancy scheme has been desired which can deal with a defect of a flash memory.

In the case of a mask ROM type semiconductor memory, data is written at the time of manufacture. Since the cell data cannot be changed after the manufacture, a yield has lowered as integration and capacity of the cell array has become high. It is therefore desired to improve the manufacturing yield.

As redundant cells for a conventional mask ROM type semiconductor memory, for example, a programmable ROM such as EPROM is additionally used in the memory cell array.

If a defective cell is found in a semiconductor memory by an operation test after manufacture, the address and data of the defective cell are written in a programmable ROM.

When an address of the defective cell is designated during a cell data read operation, the cell data written in the programmable ROM is automatically read.

A redundant cell unit of such a programmable ROM is generally larger than a mask ROM cell unit, resulting in a large chip area of the memory cell array.

Furthermore, a high voltage and a long work time is required for writing the address and data of a defective cell in the programmable ROM.

A mask ROM described in Japanese Patent Laid-open Publication No.2-203500 enables a redundancy operation without using a programmable ROM.

This mask ROM type memory cell array has a parity unit for storing parity data representing a sum of all data of memory cells at each row.

Using the parity data, a parity check circuit generates a correction bit "1" if there is a parity error and a correction bit "0" if not. In accordance with the correction bit, a data correction circuit corrects output data.

With this method, a parity in addition to data is written. It takes time to write and check parity data for each memory cell.

SUMMARY OF THE INVENTION

It is an object of the present invention to provide a novel redundancy scheme for a flash memory.

It is another object of the present invention to provide a mask ROM capable of performing a redundancy operation for a defective cell readily and speedily while suppressing a chip area increase.

According to one aspect of the present invention, there is provided a semiconductor memory device having a memory cell array divided into a plurality of cell blocks. The semiconductor memory device including: n memory cell blocks for storing n-bit data; a parity memory unit for storing a parity of the n-bit data; a defective output memory unit for storing a defective block data of a defective memory cell block among the n memory cell blocks; and a data correction circuit for correcting data in the defective cell block in accordance with data read from the memory cell blocks and the parity memory unit.

In addition to the n memory cell blocks for storing n-bit data, the parity memory unit for storing a parity of the n-bit data is provided. Accordingly, even if any one of the n memory cell blocks becomes defective, correct data for the defective cell block can be recovered from the data read from the other normal memory cell blocks and the parity read from the parity memory unit.

In this manner, a block redundancy operation for a memory can be performed by providing the parity cell block, without using a redundant memory cell block.

According to another aspect of the present invention, there is provided a semiconductor memory device including: a memory cell array of a multi-bit structure having a plurality of memory cell blocks of a mask ROM structure for storing a multi-bit data of a same address in each cell block; a parity cell block for storing parity data at a corresponding address, the parity data being an EOR value of cell data to be stored in the memory cell blocks at the same address; a defective output memory unit for storing address data of a defective one of the memory cell blocks; and a data correction circuit for correcting error data among the multi-bit cell data, in accordance with the parity data stored in the parity cell block at the same address, the address data stored in the defective output memory unit, and correct data among the multi-bit cell data read from the memory cell blocks.

A plurality of memory cell blocks and a parity cell block are assigned with the same address. It is therefore possible to read a set of data and its parity by designating only one address. Correct data can be recovered by using data other than the defective cell data and the parity. This correction can be performed by an EOR calculation.

BRIEF DESCRIPTION OF THE DRAWINGS

FIG. 7 is a block diagram showing the structure of a read-only memory according to another embodiment of the invention.

DETAILED DESCRIPTION OF THE PREFERRED EMBODIMENTS

Figure 1:
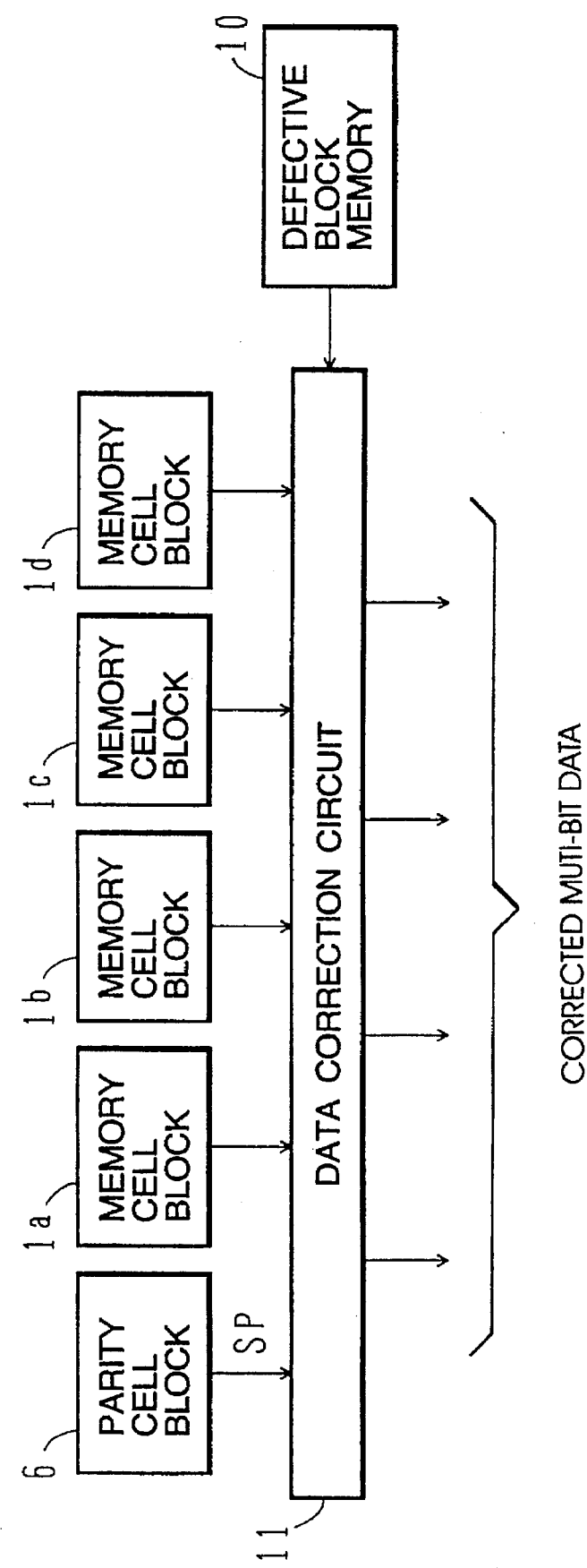
FIG. 1 is a block diagram showing a memory device according to a fundamental embodiment of the invention.

FIG. 1 is a block diagram showing the structure of a semiconductor memory device according to a fundamental embodiment of the invention.

The semiconductor memory device has a mask ROM type memory array of a multi-bit structure constructed of a plurality memory cell blocks 1 each having the same address space, a parity cell block 6, a defective block memory unit 10, and a data correction circuit 11.

An Exclusive OR (EOR) value of data of the memory cell blocks $1a$ to $1d$ at the same address is stored as parity data SP in the parity cell block 6 at the corresponding same address. The defective block memory unit 10 stores the address of a defective memory cell block 1. The data correction circuit 6 corrects one-bit error data in multi-bit cell data in accordance with the parity data SP stored in the parity cell block 6, the address of a defective block stored in the defective block memory unit 10, and the multi-bit cell data read from normal memory cell blocks 1. The data correction circuit 11 then outputs correct multi-bit data.

If a memory cell in each cell block at a designated address is normal, the defective block memory unit 10 does not output a signal and the data correction circuit 6 outputs data received from the cell blocks $1a$ to $1d$.

If a memory cell in any cell block at a designated address is abnormal or defective, the defective block memory unit 10 outputs the block address of the block containing the defective memory cell. The data correction circuit 11 generates original correct data of the defective memory cell in the cell block, by using the parity data SP and data from the correct cell blocks, and outputs correct multi-bit data.

Correct data can be generated by a process of replacing error data by a predetermined signal and executing an Exclusive OR (EOR) operation.

The parity cell block 6 stores parities of data stored in a plurality of cell blocks at the same address. In the case of a flash memory, a parity signal is generated by an EOR operation of write data, and stored in the parity cell block 6. In the case of a mask ROM, data and parities to be written at a manufacture process are known, and they are written in the memory cell blocks and parity cell block at the time of manufacture.

There is no essential difference of data read between a flash memory and a mask ROM.

Figure 2:
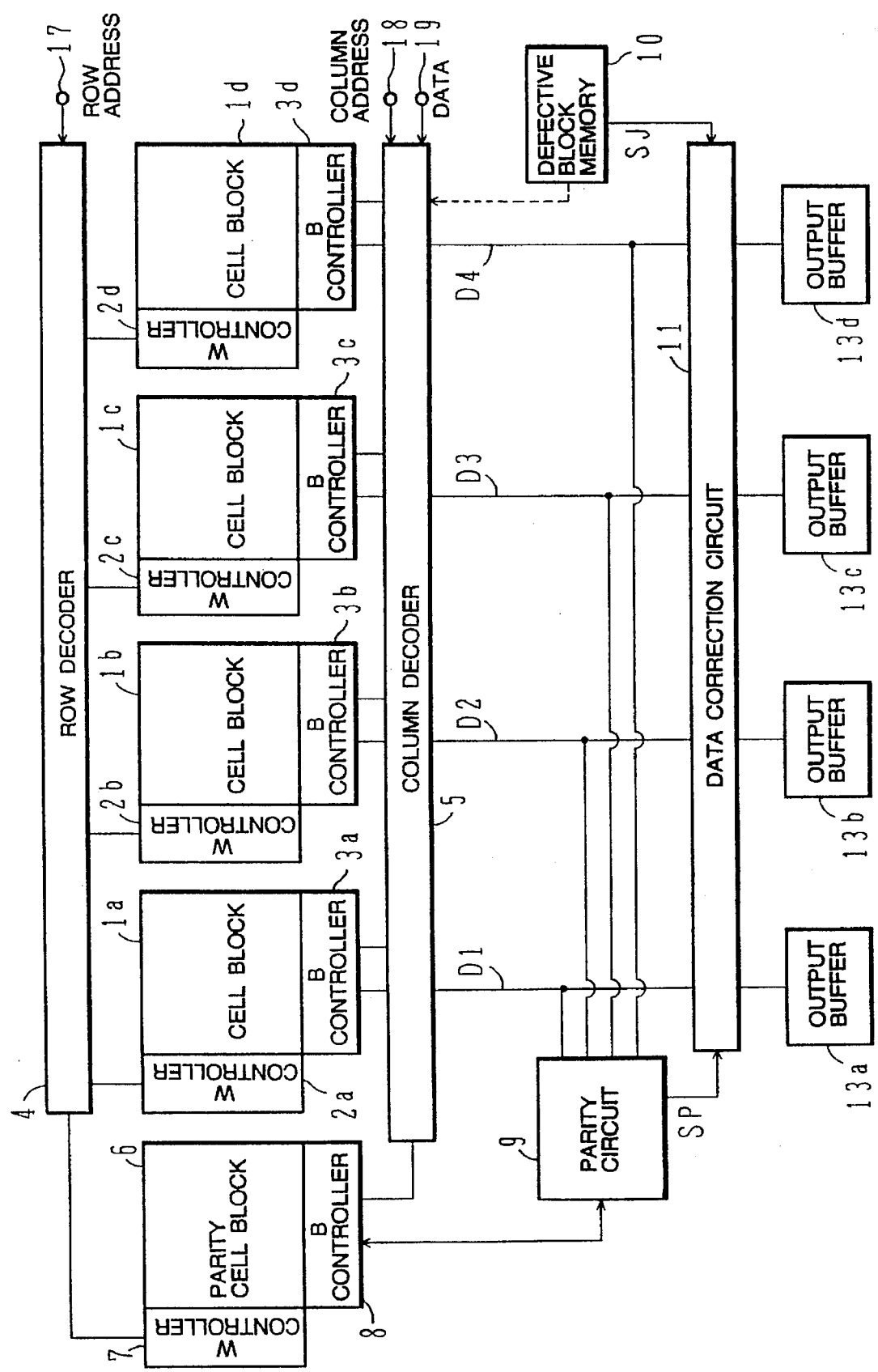
FIG. 2 is a circuit block diagram showing the structure of a flash memory according to an embodiment of the invention.

FIG. 2 is a circuit block diagram of a flash memory according to an embodiment of the invention. Memory cell blocks $1a$, $1b$, . . . store n-bit data and have cells disposed in a matrix. In this embodiment, four memory cell blocks (n=4) are used each having a word controller 2 for controlling word lines and a bit controller 3 for controlling bit lines.

Figure 3:
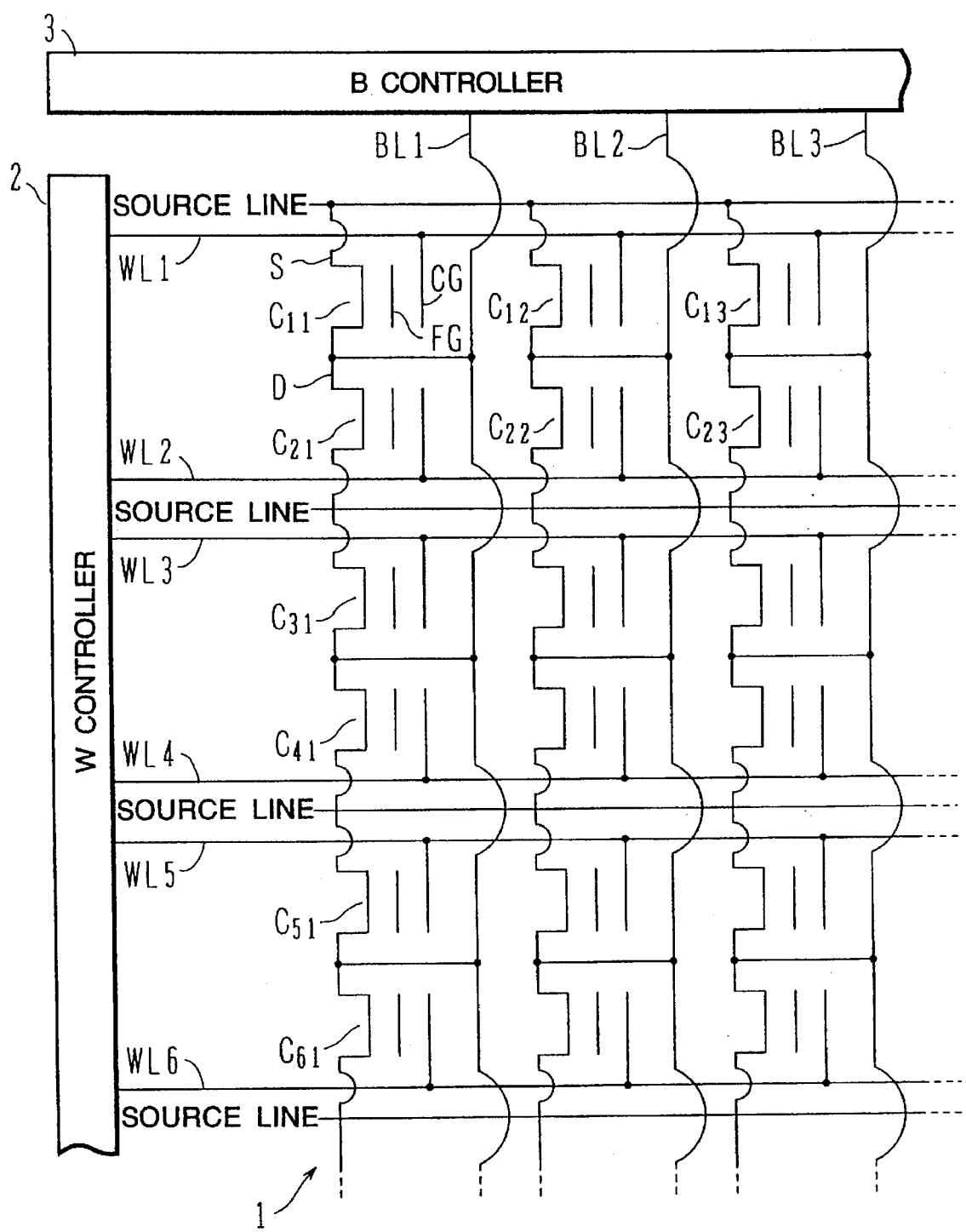
FIG. 3 is a circuit diagram of a cell block of the flash memory shown in FIG. 2.

FIG. 3 shows the detailed structure of the memory cell block 1. The memory cell block 1 has a number of nonvolatile memory cells Cij of a floating gate type transistor disposed in a matrix.

This memory cell block 1 will be described by taking a memory cell C11 as an example. The source S of a MOS transistor having a floating gate FG is connected to a source line, and the drain D thereof is connected to a bit line BL1. A control gate CG formed over the floating gate FG is connected to a word line WL1.

Data read/write of this memory cell C11 is performed by controlling voltages to be applied to the bit line BL1 and word line WL1. The control gates CG of memory cells disposed at each row are connected in common to the same word line WL, whereas the drains D disposed at each column are connected in common to the same bit line BL. Each word line WL is controlled by the word controller 2, and each bit line BL is controlled by the bit controller 3.

Figure 4:
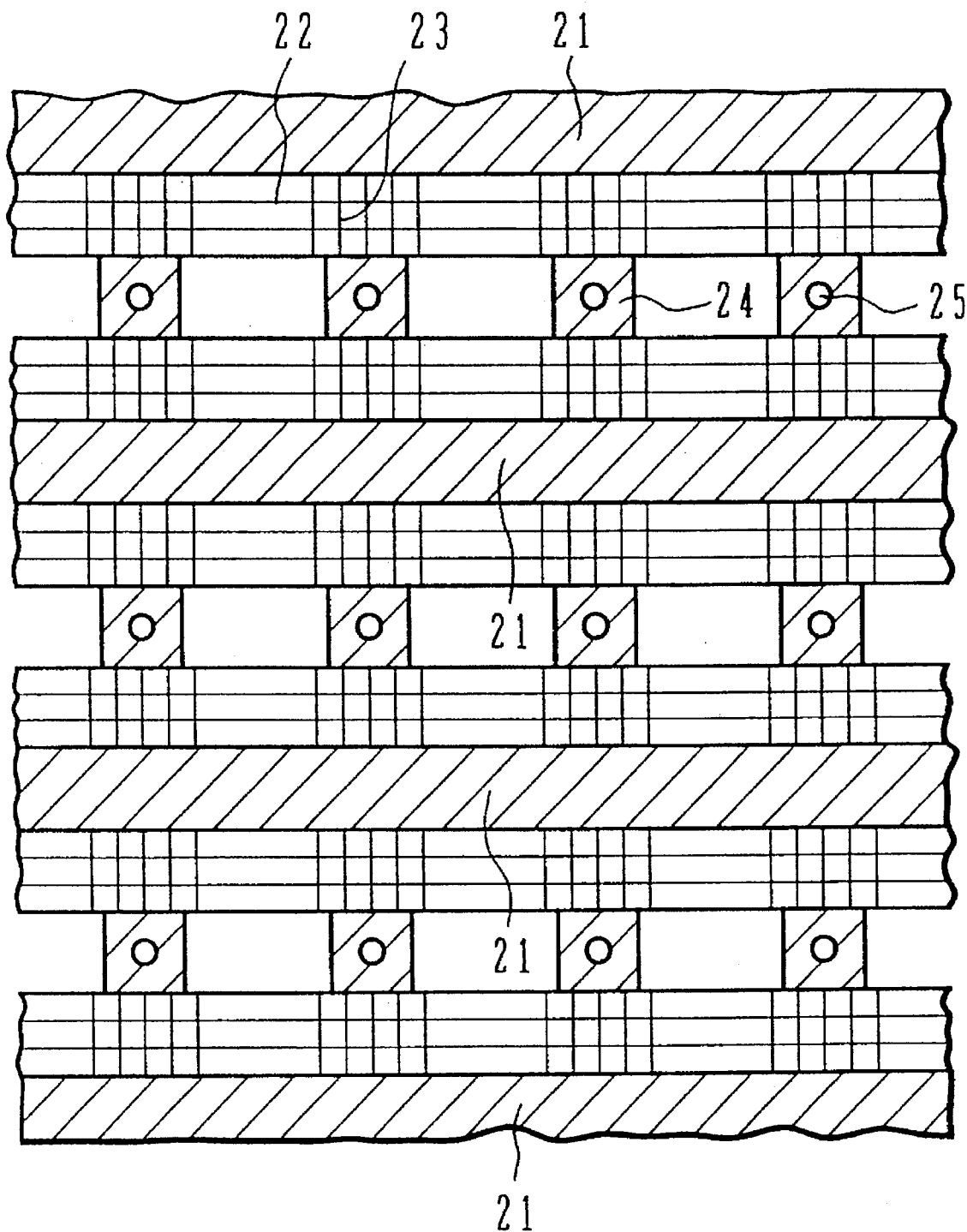
FIG. 4 is a schematic plan view showing the layout of a semiconductor chip of the cell block shown in FIG. 3.

FIG. 4 is a schematic plan view showing the layout of the memory cell block shown in FIG. 3. A plurality of source regions (source lines) 21 continuous in the horizontal direction in FIG. 4 are disposed in the column direction. A number of non-volatile memory cells are connected between two consecutive source regions 21. Each drain region 24 is used in common by two non-volatile memory cells formed between upper and lower source lines 21.

A floating gate electrode 23 in an electrically floating state is disposed over a channel region formed between the source line 21 and drain region 24, a control electrode (word line) 21 being formed over the floating gate electrode 23 extending in the horizontal direction in FIG. 4. A bit line (not shown) is disposed in the vertical direction in FIG. 4 and connected via a bit contact hole 25 to the drain region 24.

In the structure shown in FIG. 4, a memory cell matrix has word lines disposed in the horizontal direction and bit lines disposed in the vertical direction. A source line is disposed in parallel with the word line.

Referring back to FIG. 2, the word controller 2 of each cell block 1 is connected to and controlled by a row decoder 4. The bit controller 3 is connected to and controlled by a column decoder 5, and transfers data to and from the memory cell block 1. The row decoder 4 receives a row address signal from a terminal 17, and the column decoder 5 receives a column address signal from a terminal 18. Data is supplied from a terminal 19.

A parity cell block 6 having the same structure as the memory cell block 1 is connected in parallel with the memory cell blocks 1. The parity cell block 6 has a word controller 7 for controlling its word lines and a bit controller 8 for controlling its bit lines, the controllers 7 and 8 being connected to the row decoder 4 and column decoder 5.

Figure 5:
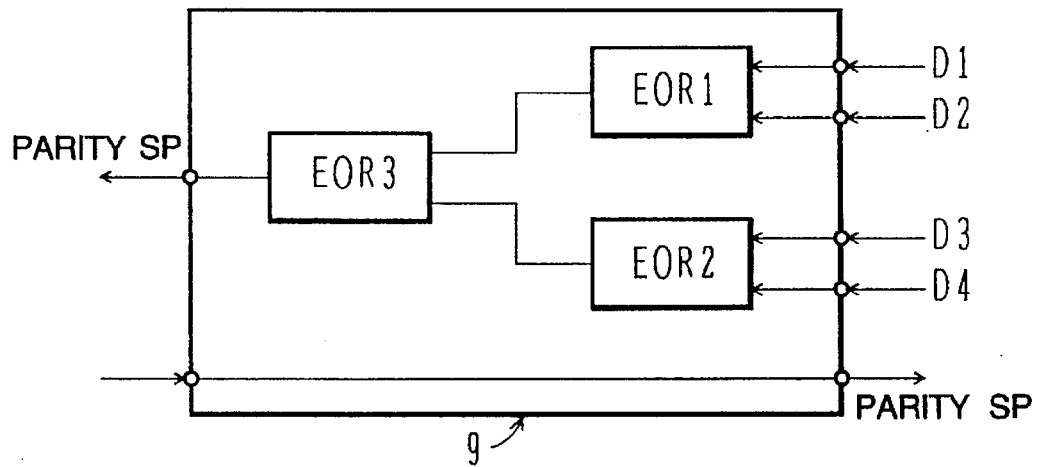
FIG. 5 is a block diagram showing the structure of a parity circuit of one embodiment.

The parity circuit 9 receives n-bit data on data lines D1 to D4 and calculates a parity for the n-bit data. The parity circuit 9 has a structure such as shown in FIG. 5. An EOR of inputted data D1 to D4 is calculated by EOR gates EOR1 to EOR3, and the EOR is outputted as a parity SP. This parity signal SP from the parity circuit 9 is supplied via the bit controller 8 to the parity cell block 6 and stored therein.

The defective block memory unit 10 stores the address of a defective block 1 if any. The defective block memory unit 10 is required to have a function of storing the address of a defective cell block and preferably of further storing the defective address in the block, and it may be made of fuses. The defective block memory unit 10 supplies its output signal to the data correction circuit 11, or in some case the signal may be supplied also to the column decoder 5. The data correction circuit 11 is connected to the data lines D1 to D4 from the cell blocks 1a to 1d and to the parity circuit 9. In a data read operation, the data correction circuit 11 receives the data D1 to D4 from the cell blocks 1a to 1d and the parity signal SP from the parity circuit 9. If a read address coincides with the defective block address stored in the defective block memory unit 10, a signal SJ representative of the defective block is outputted from the defective block memory unit 10 to the data correction circuit 11. In this case, data from the defective cell block is not used, but data read from the other cell blocks and the parity signal supplied from the parity cell block are used to generate correct data. Correct multi-bit data is then supplied to output buffers 13.

Figure 6:
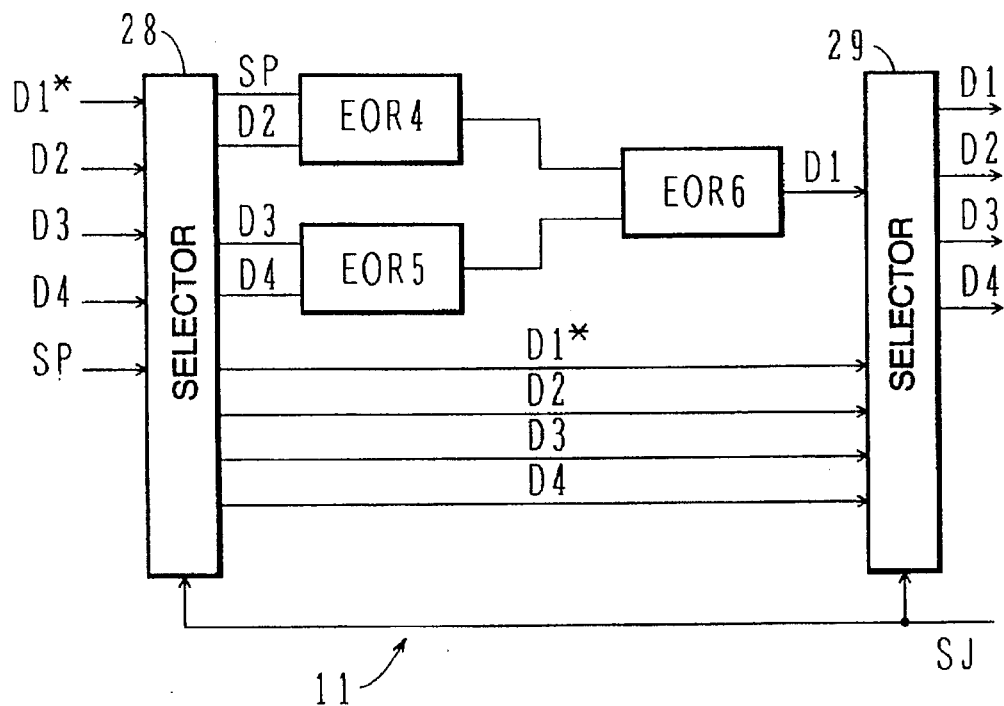
FIG. 6 is a block diagram showing the structure of a data correction circuit of one embodiment.

FIG. 6 shows an example of the structure of the data correction circuit 11. A selector 28 receives outputs D1 to D4 from the four memory cell blocks 1a to 1d, a parity bit SP supplied from the parity cell block 6 via the parity circuit 9, and a signal SJ identifying the error data supplied from the defective block memory unit 10, and supplies three correct data excepting the error data and parity signal to two EOR gates EOR4 and EOR5. In an example shown in FIG. 6, D1 is assumed to be error data. Outputs of EOR4 and EOR5 are supplied to EOR6 which supplies an EOR of three correct data and the parity to another selector 29. The selector 29 receives original four data D1 to D4, corrected data, and defective block identifying signal SJ, and outputs correct data D1 to D4.

For example, it is assumed that under the condition that the correct data is (1 1 0 0) and the parity is "0", the memory block 1a is defective and outputs "0". In this case, EOR4 outputs an EOR "1" of the parity 0 and D2=1, and EOR5 outputs an EOR "0" of D3=0 and D4=0. EOR6 outputs an EOR "1" of "1" and "0". In this manner, the correct data D1=1 is recovered.

As described above, a block redundancy operation can be performed by using parities stored in the parity cell block, without using a conventional redundant cell block. The operation of the embodiment will further be detailed by taking four cell blocks as an example.

A cell address is designated by a cell block address, a row address, and a column address. It is assumed that the cell block 1a is defective and that data (1 1 0 0) is to be stored in the cell blocks 1a to 1d at the same address (1 1).

Data (1 1 0 0) is supplied from the terminal 19 to the data lines D1 to D4. The parity circuit 9 generates a parity "0" from the supplied data (1 1 0 0), and stores it in the parity cell block 6 at the address (1 1).

In a store operation, data (1 1 0 0) is stored in the cell blocks 1a to 1d. When the cell block 1a is defective, however, the defective cell block 1a stores its data "1" erroneously.

In a read operation, the data is read from the cell blocks 1a to 1d and supplied via the data lines D1 to D4 to the data correction circuit 11. The parity data SP read from the parity cell block 6 via the parity circuit 9 is also supplied to the data correction circuit 11. In addition to the data from the cell blocks 1 and the parity data SP from the parity cell block 6, the data correction circuit 11 also receives the defective block identifying signal SJ indicating the defective cell block 1a from the defective block memory unit 10.

Since data and parity are stored in the memory cell blocks and parity cell block at the same address, the signal SJ is sufficient if it identifies the defective block, without identifying a defective memory cell address in each memory cell block.

The data correction circuit 11 generates correct data D1 of the cell block 1a at the address (1 1), by using the data D2 to D4 in the normal cell blocks 1b to 1d and the parity signal SP, and supplies correct data D1 to D4 to the output buffers 13a to 13d. In the above manner, even if a defective cell block is present, proper data read/write is ensured.

The defective block memory unit 10 may be used with the column decoder 5 in order not to write data in a defective cell block during a data write operation. In an erase operation, data in all cells of the cell blocks 1a to 1d and parity block 6 are erased at the same time. Although the above embodiment uses a 4-bit structure, it is apparent to those skilled in the art that other structures such as 8-bit, 16-bit structures may also be used.

With the above structure, address translation is not necessary even if a defective cell block is present. The flash memory constructed as above can be operated as if all cell blocks are normal, by using the parity cell block 6 and its controllers 7 and 8, parity circuit 9, defective block memory unit 10, and data correction circuit 11.

Other modifications are possible. For example, a single parity may be provided for each set of 2×n-bit structure if data read/write is performed in units of 2×n-bits.

In the flash memory described above, it is necessary to calculate and store a parity each time new data is written so as to generate correct data. In a mask ROM, data to be stored is programmed on a mask and written in a semiconductor chip as fixed data. Therefore, parities are also written as fixed data. A defective memory cell is detected only at a test after manufacturing it. Error data is corrected by using defective memory cell information and a parity.

FIG. 7 shows an embodiment of a mask ROM of a 4-bit structure. Memory cell blocks 1a to 1d are a mask ROM of a multi-bit structure. A parity cell block 6 is also a mask ROM having the same structure.

Figure 8A:
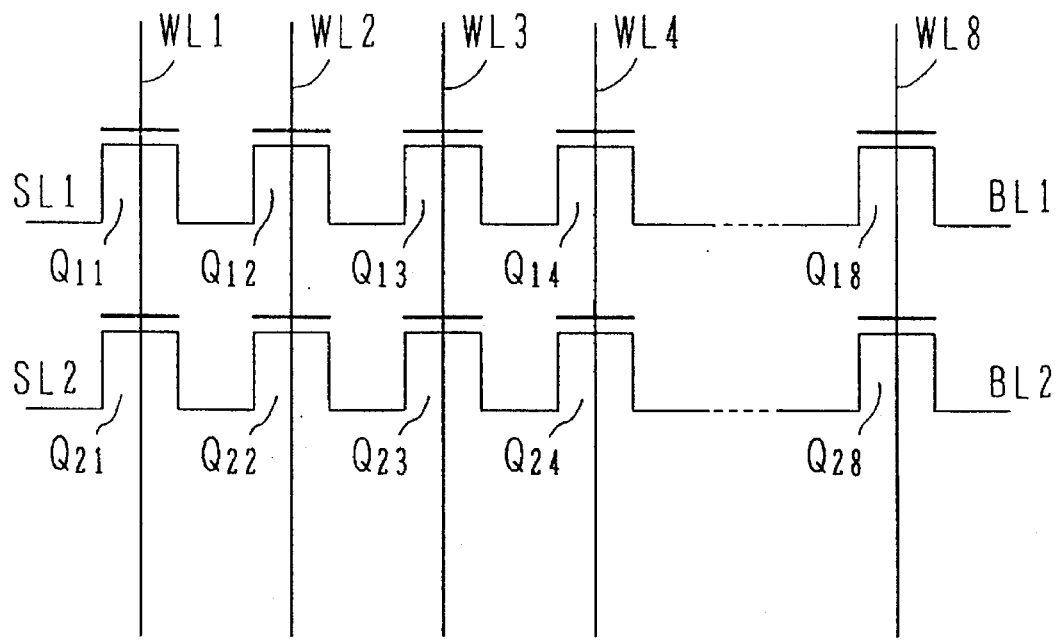
FIGS. 8A and 8B are circuit diagrams showing the structure of a ROM memory cell block of one embodiment.
Figure 8B:
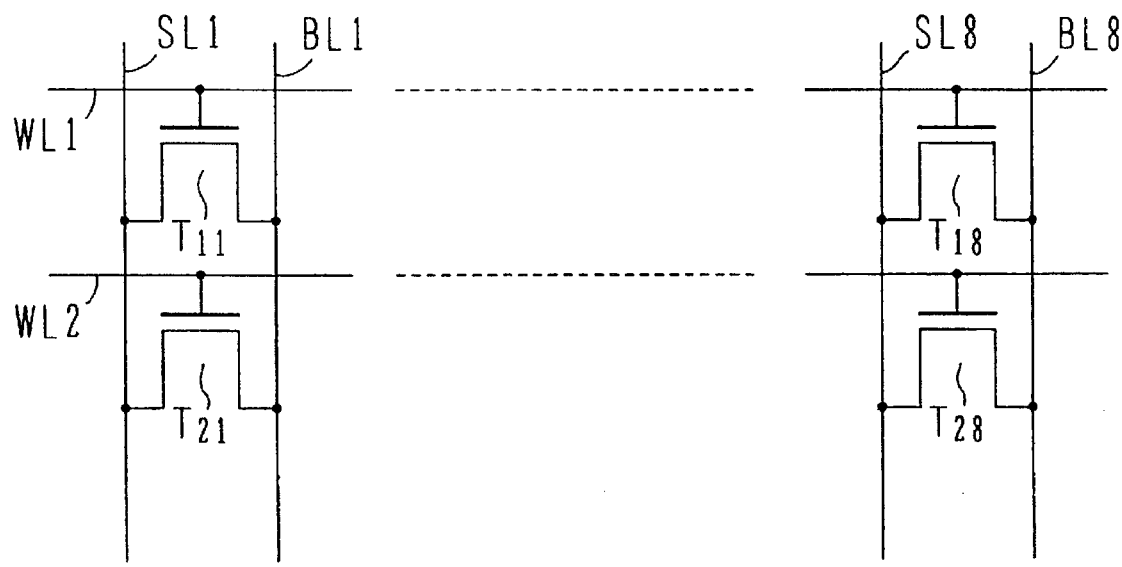

FIGS. 8A and 8B show examples of circuit structures of a mask ROM. FIG. 8A shows a NAND type mask ROM. MOS transistors $Q_{11}$ to $Q_{18}$ are serially connected between a source line SL1 and a bit line BL1. Similarly, MOS transistors $Q_{21}$ to $Q_{28}$ are serially connected between a source line SL2 and a bit line BL2. The gates of the MOS transistors $Q_{11}, Q_{21}, \ldots$ are connected to a word line WL1. Similarly, the gates of the transistors at the same column are connected to the same word line.

Write data is stored in MOS transistors by selectively implanting impurity ions in their channels. A memory cell having data "0" is of a depletion or normally ON mode, and a memory cell having data "1" is of an enhancement or normally OFF mode. A low/high level signal is applied to the word line. A depletion mode transistor is always on independently from a potential on the word line. An enhancement mode transistor is on when the word line is high and off when it is low.

When a high level signal is applied to the word lines of all memory cells, all memory cells turn on. Under this condition, the word lines are sequentially driven by a low level signal one word line after another. If the corresponding memory cell is "0" (depletion mode), a bit line current does not change. If it is "1" (enhancement mode), a bit line current changes.

FIG. 8B shows an example of the structure of a NOR type mask ROM. MOS transistors $T_{11}, \ldots, T_{18}, T_{21}, \ldots, T_{28}$ are disposed in a matrix. The gates of the transistors $T_{11}, \ldots, T_{18}$ on the same row are connected to the same word line WL1. The sources and drains of the transistors $T_{11}, T_{21}, \ldots$ on the same column are connected to the same source line SL1 and bit line BL1, respectively.

The channel of each transistor is selectively implanted with impurity ions to set it to have a high threshold value HVth or a low threshold value LVth. A drive voltage applied to the word line has an intermediate potential between LVth and HVth.

When a predetermined voltage is applied across the source line SL and bit line BL and a drive voltage is sequentially applied to each word line, a bit line current corresponding to the threshold value of the corresponding memory cell is obtained.

Similar to the flash memory shown in FIG. 2, each memory cell block 1 of FIG. 7 is connected to a word line controller 2 and a bit line controller 3. A row address from an address circuit 33 is supplied to a row decoder 4 whose output is supplied to the word line controller 2 which generates a word line select signal. In this manner, the word line of the four memory cell blocks at the same row address is driven. Similarly, a column address from the address circuit 33 is supplied to a column decoder 5. In accordance with a column address signal CA, bit lines of the memory cell blocks 1a to 1d at the same column address are selected.

Data in a cell identified by the selected word line and bit line is read. The read data is outputted via a sense amplifier to a data correction circuit including an output change circuit 32 and a correction circuit 31.

The word select signal from the row decoder 4 and the bit line select signal from the column decoder 5 are also supplied to the parity cell block 6.

The parity cell block 6 has the same numbers of rows and columns as the memory cell blocks 1a to 1d. The word line select signal is inputted to the word line controller 7 to select the word line at the same row address as the memory cell blocks 1a to 1d. In accordance with the column address signal CA, bit lines having the same column address as the memory cell blocks 1a to 1d are selected.

Each memory cell of the parity cell block 6 stores parity data of the memory cell blocks 1a to 1d. If there is a defective memory cell, error data in the defective memory cell block can be recovered by using data read from the normal memory cell blocks and parity.

The parity cell block 6 stores EOR values of correct cell data in the cell blocks 1a to 1d at the same address, as parity data.

Parity data SP at the memory cell identified by the word line and bit line signals from the row decoder 4 and column decoder 5 is outputted from the parity cell block 6 to the data correction circuit 31.

The column address signal CA is also supplied to a defective output memory unit 10. An address of a defective memory cell detected by an operation test after manufacturing the mask ROM is being stored in the defective output memory unit 10.

An address of a defective cell is separated into a row and column address and a block address which are stored in a defective column and row address memory 34 and a defective block address memory 35. A row and column address from the address circuit 33 is compared with the defective row and column address from the defective address memory 34 by a comparison circuit 36. At the same time, the defective block address corresponding to the defective row and column address is supplied from the defective block address memory 35 to an output switch circuit 37. When the comparator circuit 36 detects that the row and column address from the address circuit 33 is the defective row and column address, a detect signal is supplied to the output switch circuit 37 which in turn supplies a defective block identifying signal SJ to the output switch circuit 32 and correction circuit 31.

Figure 9:
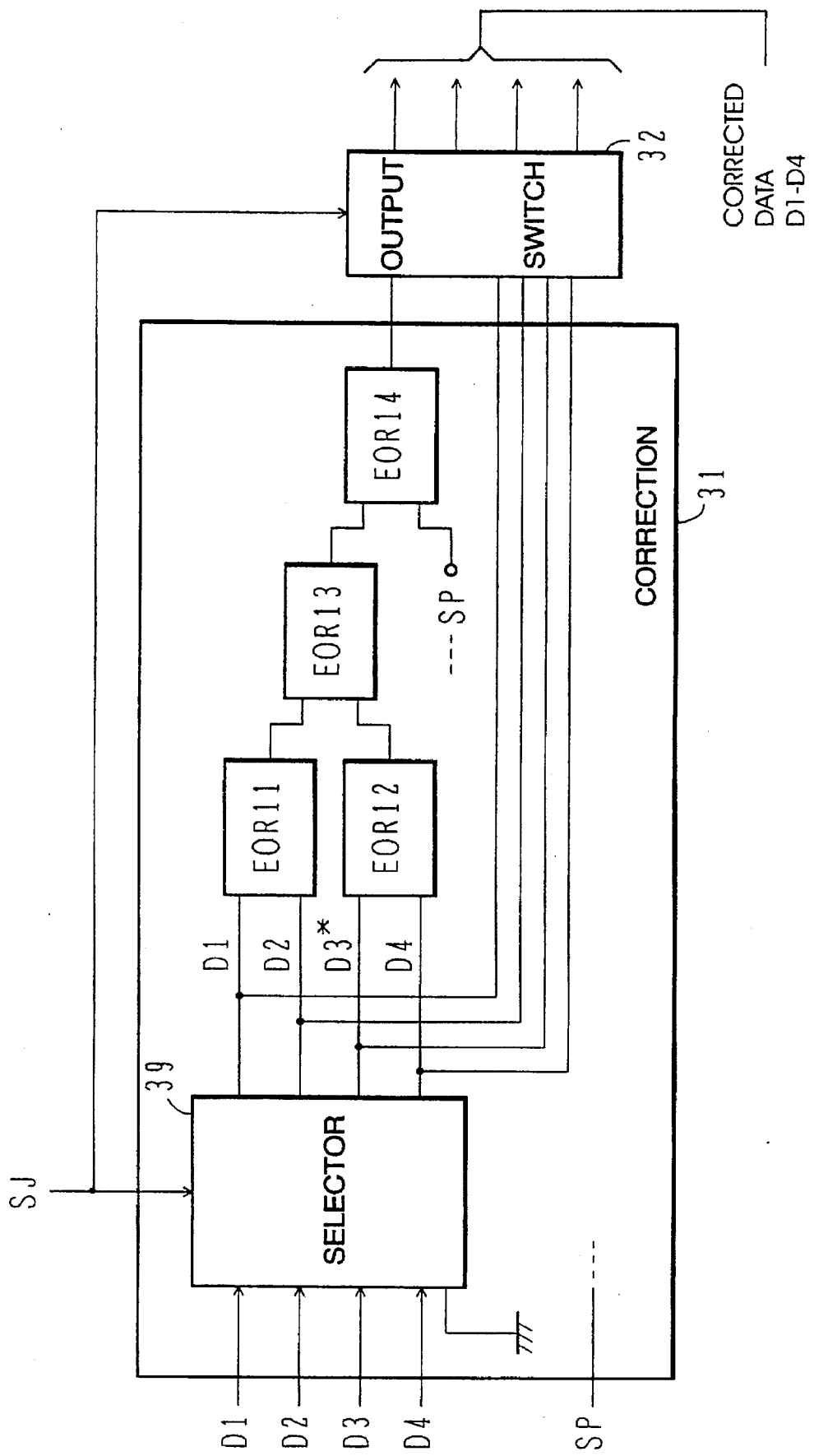
FIG. 9 is a circuit diagram showing the structure of a data correction circuit of one embodiment.

FIG. 9 shows an example of the structure of the correction circuit 31 and output switch circuit 32. The correction circuit 31 has a defective bit selector 39 and EOR gates EOR11 to EOR14. The selector 39 receives data D1 to D4 and the defective block identifying signal SJ supplied from the output switch circuit 37. The selector 39 is also supplied with an "0" input (ground signal).

It is assumed now that a memory cell in the memory block 1c is defective and the defective block identifying signal SJ identifies the data D3. In this case, the selector 39 receives the output switch signal SJ identifying D3. The selector 39 selects the "0" signal as data D3* in place of data D3, and inputs data D1, D2, D3*, and D4 to EOR 11 and EOR 12. EOR13 outputs an EOR value of the four input data. This EOR value and parity SP are used to obtain another EOR value at EOR14, and the obtained EOR value is supplied as a correct signal D3 to the output change circuit 32. Upon reception of the four signals D1, D2, D3*, and D4 supplied from the selector 39, output switch signal SJ, and correct signal D3, the output switch circuit 32 selects the correct signal D3 in place of D3* and outputs correct data D1 to D4.

If the output switch circuit 32 does not receive the output switch signal SJ, the read data D1 to D4 supplied from the correction circuit 31 is directly outputted therefrom. Instead of receiving the read data from the selector 39, the output switch circuit 32 may directly receive the read data D1 to D4 as shown by broken lines in FIG. 7.

In summary, a defective memory cell block of the mask ROM is detected by an operation test at the production delivery time. If there is a defective memory cell block among the four memory cell blocks 1a to 1d, the defective memory cell block information is stored in the defective output memory unit 10. The defective block can be detected for each address.

In a data read operation, in accordance with a row address RA and column address CA, cell data D1 to D4 and parity data SP respectively stored in the memory cell blocks 1a to 1d and parity cell block 6 at the same address are read and supplied to the data correction circuit 31, 32.

The data correction circuit 31, 32 operates by using the cell data D1 to D4, parity data SP, and defective memory block signal SJ. For example, assuming that the memory cell block 1a is defective, the data correction circuit 31, 32 uses the output signal from the correction circuit 31 instead of the cell data D1, and supplies it and other correct cell data D2 to D4 to output buffers 13a to 13d.

As a result, error cell data is corrected and correct data D1 to D4 are outputted.

In the above manner, if there is any defective memory cell block in the mask ROM, the data correction circuit 31, 32 automatically corrects error data by using the parity data stored in the parity cell block and the defective memory cell address information stored in the defective output memory unit 10.

Parity data stored in the parity cell block 6 is an EOR value of cell data to be stored in the memory cell blocks at the same address. The defective output memory unit 10 is sufficient only if it stores the address of a defective memory cell. It is therefore possible to reduce the capacity of the defective output memory unit 10 and shorten the time required for writing address data.

In the above embodiment, a mask ROM of a 4-bit structure has been used. A mask ROM of other structures such as a 2-bit structure and an 8-bit structure may also be used.

The present invention has been described in connection with the preferred embodiments. The invention is not limited only to the above embodiments. For example, any one of the error correction circuits shown in FIGS. 6 and 9 may be used interchangeably. The structure of a memory array is not limited only to the embodiment structures. It is apparent to those skilled in the art that various modifications, substitutions, improvements, combinations and the like can be made without departing from the scope of the appended claims.

We claim:

1. A semiconductor memory device having a memory cell array divided into a plurality of cell blocks, comprising:

n memory cell blocks, for storing n-bit data, one bit of the n-bit data being stored per one memory cell block at a same address thereof;

a parity memory unit for storing a parity of said n-bit data at an address corresponding to the address where said n-bit data is stored;

a defective output memory unit for storing defective block data indicating a defective memory cell block among said n memory cell blocks; and a data correction circuit for correcting data in said defective memory cell block by calculating an exclusive OR of (n−1) bits of said n-bit data and the parity, the (n−1) bits being stored in said memory cell blocks at the same address except for one memory cell block indicated by said defective output memory unit, the parity being stored in said parity memory unit at the corresponding same address.

2. A semiconductor memory device according to claim 1, wherein each of said memory cell blocks and said parity memory unit have a same memory function.

3. A semiconductor memory device according to claim 1, wherein n-bit data read from said n memory cell blocks constitutes one output unit.

4. A semiconductor memory device according to claim 1, wherein the semiconductor memory device is a flash memory device.

5. A semiconductor memory device according to claim 4, wherein said defective output memory unit is made of a read-only memory.

6. A semiconductor memory device according to claim 1, wherein said data correction circuit includes exclusive OR circuit which calculates an exclusive OR of data read from normal ones of said n memory cell blocks and a parity read from said parity memory unit.

7. A semiconductor memory device according to claim 6, further comprising a parity generator for calculating a parity of data to be written.

8. A semiconductor memory device according to claim 1, wherein the semiconductor memory device is a mask ROM device.

9. A semiconductor memory device according to claim 8, wherein said parity memory unit is made of a mask ROM.

10. A semiconductor memory device according to claim 8, wherein said defective output memory unit is made of a once-programmable read-only memory.

11. A semiconductor memory device comprising:

a memory cell army of a multi-bit structure having n memory cell blocks of a mask ROM structure, for storing n-bit data, one bit of the n-bit data being stored per one memory cell block at a same address per memory cell block as other bits of the n-bit data being stored;

a parity cell block for storing parity data for said n-bit data at an address corresponding to the address where said n-bit data is stored, said parity data being an EOR value of said n-bit data;

a defective output memory unit for storing defective block data indicating a defective one of said memory cell blocks; and a data correction circuit for correcting an error bit among said n-bit data, by calculating an exclusive OR of (n−1) bits of said n-bit data and the parity, the (n-1) bits being stored in said memory cell blocks at the same address except for one memory cell block indicated by said defective output memory unit, the parity being stored in said parity cell block at the corresponding same address, and to correct data among said n-bit data read from said memory cell blocks.

12. A semiconductor memory device according to claim 11, wherein:

custom data is written in said memory cell blocks at the time of manufacturing the semiconductor memory device;

said parity data is written in said parity cell block at the time of manufacturing the semiconductor memory device;

said defective output memory unit stores said address data of a defective memory cell block;

correct data read from said memory cell blocks at an address designated by an external address signal is outputted via said data correction circuit; and said parity data selected by said external address signal is an EOR value calculated from a data train to be stored in said memory cell blocks at said address designated by said external address signal.

* * * * *